United States Patent [19]

Nakayama

[11] Patent Number: 5,296,938
[45] Date of Patent: Mar. 22, 1994

[54] ADDRESS GENERATING METHOD, AND CIRCUIT THEREFOR

[75] Inventor: Tadayoshi Nakayama, Tokyo, Japan

[73] Assignee: Canon Kabushiki Kaisha, Tokyo, Japan

[21] Appl. No.: 733,143

[22] Filed: Jul. 19, 1991

[30] Foreign Application Priority Data

Jul. 31, 1990 [JP] Japan .................................. 2-201107

[51] Int. Cl.$^5$ ............................................. H04N 1/40
[52] U.S. Cl. ..................................... 358/448; 358/460
[58] Field of Search ............... 358/403, 460, 442, 444, 358/445, 448, 462, 474, 433, 443; 382/9; 395/115, 116

[56] References Cited

U.S. PATENT DOCUMENTS

| | | | |
|---|---|---|---|
| 4,951,157 | 8/1990 | Koh et al. | 358/433 |
| 4,958,236 | 9/1990 | Nagashima et al. | 358/445 |
| 4,999,715 | 3/1991 | Porrellio et al. | 358/444 |

*Primary Examiner*—Edward L. Coles, Sr.
*Assistant Examiner*—Jerome Grant
*Attorney, Agent, or Firm*—Fitzpatrick, Cella, Harper & Scinto

[57] ABSTRACT

An address generating circuit for generating addresses capable of scanning two-dimensionally arrayed data in zigzag fashion includes an up/down counter for generating addresses in the column direction of the two-dimensional array, an up/down counter for generating addresses in the row direction of the two-dimensional array, and a circuit block for detecting, based upon a three-bit column address and a three-bit row address outputted by respective ones of the counters, whether an address is situated on an edge portion of the two-dimensional array, and for producing an up-count control signal and a down-count control signal of each counter in accordance with the results of detection. This makes it possible to generate addresses that are capable of scanning the two-dimensionally arrayed data in zigzag fashion. Also disclosed is a method of generating addresses using this circuit.

13 Claims, 12 Drawing Sheets

| RESULTS OF ADDRESS-VALUE DETECTION | | | | | CONTROL CONTENT |
| --- | --- | --- | --- | --- | --- |
| C0 = R0 | CA = 0 | CA = 7 | RA = 0 | RA = 7 | |
| H | | L | | | CA + |
| L | L | | | L | CA - |
| L | | | | H | CA + |
| | | H | | H | CA + |
| L | | | | L | RA + |
| H | | L | L | | RA - |
| H | | H | | | RA + |

C0 : LEAST SIGNIFICANT BIT OF COLUMN ADDRESS
R0 : LEAST SIGNIFICANT BIT OF ROW ADDRESS
CA : COLUMN ADDRESS
RA : ROW ADDRESS
CA+, RA+ : CONTROL COUNT-UP OF CORRESPONDING
            UD COUNTER
CA -, RA - : CONTROL COUNT-DOWN OF CORRESPONDING
            UD COUNTER

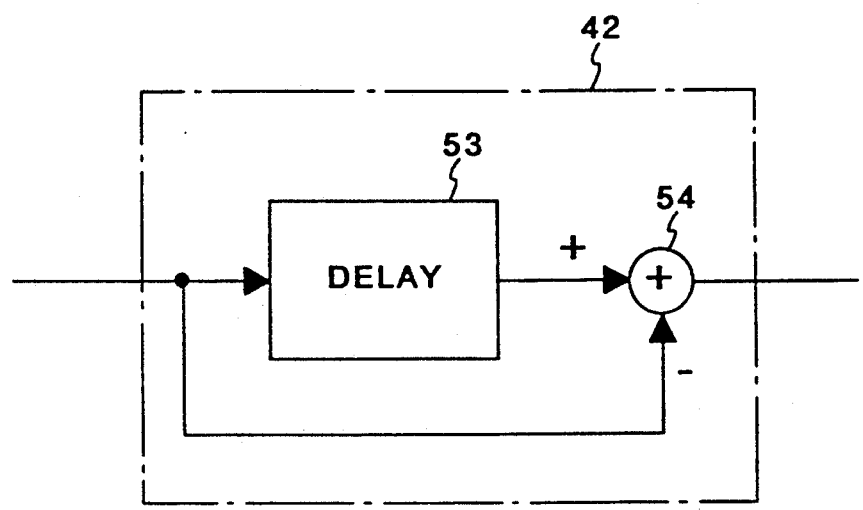
F I G. 11

ADDRESS GENERATING METHOD, AND CIRCUIT THEREFOR

BACKGROUND OF THE INVENTION

1. Field of the Invention

This invention relates to an address generating method and circuit for generating addresses of a buffer memory used when converting the scanning direction of image data, particularly addresses of a memory which stores two-dimensionally arrayed data.

2. Description of the Prior Art

Recent progress in semiconductor technology has made it possible to process two-dimensional image data, which is generated at high speed and in large quantities, in the form of a digital signal on a real-time basis.

Since image data contains a very large amount of information, preserving the data in its present form necessitates a memory having an enormous capacity. Accordingly, data-compression processing is often executed in order to economize on the amount of memory used.

One example of data-compression processing which recently has become the center of much attention is referred to as a discrete cosine transformation. This is a modification of a discrete Fourier transformation and requires that a matrix operation be performed twice to transform one block. It is possible for such a matrix operation to be executed in real-time by using an LSI referred to as the "A121" (manufactured by SGS-Tomson), by way of example.

In accordance with such a transformation, if data prior to the transformation is data in real space, then the data after the transformation will be data in frequency space (or more precisely, data in space approximating frequency space). Accordingly, in order to return the transformed data to the original data in real space, a reverse-discrete cosine transformation is required to be executed. This reverse transformation also is executed twice, and such execution is possible with the "A121" LSI mentioned above.

It should be noted that merely executing the discrete cosine transformation and reverse transformation described thus far does not result in any data compression whatsoever. In order to perform data compression, it is necessary to apply re-quantization or the like to the data, in frequency space, resulting from the discrete cosine transformation.

Furthermore, if data compression is to be performed to a greater degree, the re-quantized data in frequency space must be arrayed in ascending order in terms of frequency, and Huffman coding (one type of variable-length coding) must be carried out.

The JPEG (Joint Photographic Expert Group) has set up standards regarding methods of data compression.

The present invention concerns means by which data in frequency space can be arrayed in ascending order in terms of frequency.

The "ascending order of frequency in frequency space having a two-dimensional spread" referred to here is the order of the kind shown in FIG. 6. Ordinarily, the scanning of data in this fashion is referred to as "zigzag" scanning.

In the prior art, the rearrangement of data (hereinafter referred to as "scan conversion") is carried by a configuration of the kind shown in FIG. 7. The scan conversion operation will now be described with reference to FIG. 7.

Ordinarily, data cut into a square shape is scanned through a sequence of the kind shown in FIG. 8(a) or (b) to perform a data transfer. Further, an input/output sequence of data in a discrete cosine transformation LSI described above is similar to this sequence. The data thus scanned is inputted through an input terminal 306 shown in FIG. 7 and written in a memory 305.

The address information of the memory 305 which stores this data is generated by a counter 301 and applied to the memory 305 via a selector 303. If the scanning sequence of the input data is made that of FIG. 8(a) and the image size is limited to 8×8 pixels, the storage addresses of the data will have the values shown in FIG. 9. In order to read the stored data through the zigzag scanning sequence shown in FIG. 6, the corresponding addresses must be applied to the memory.

More specifically, in order to generate addresses, it is required that the output of the decoder 301 be decoded or that these addresses be read out of a memory in the order in which they were generated. However, with a data size of 8×8 pixels, the addresses are 64 values and therefore a decoder circuit of very large scale is required. Accordingly, the usual practice is to adopt the latter method, namely the arrangement using the memory in which the zigzag scanning addresses have been stored in the order in which they were generated. This memory is a ROM (read-only memory) 701 shown in FIG. 7. At this time the ROM 701 is selected by the selector 303 so that the addresses are applied to the memory 305.

By virtue of the above-described arrangement, the data that has been written in the memory 305 is read out in the zigzag scanning sequence based upon the address information generated by the ROM 701 via the selector 303, and this data is outputted to an output terminal 307.

Furthermore, an address signal for reading the address information out of the ROM 701 in order is supplied by the counter 301.

However, in the case where the two-dimensionally arrayed data transferred by the ordinary scanning method is scanned and transformed in zigzag fashion according to the example of the prior art described above, a memory for address conversion is required, the number of component parts increases and cost is raised.

SUMMARY OF THE INVENTION

Accordingly, an object of the present invention is to provide a simply constructed, inexpensive address generating circuit that solves the aforementioned problems.

Another object of the present invention is to provide an address generating method for generating addresses which enable two-dimensionally arrayed data to be scanned in zigzag fashion.

According to the present invention, the foregoing objects are attained by providing an address generating circuit for generating addresses of a memory which stores two-dimensionally arrayed data, comprising address generating means for generating column and row addresses of the two-dimensionally arrayed data, detecting means for detecting, based upon each address from the address generating means, whether an address is situated on an edge portion of the two-dimensionally arrayed data; and control means for controlling address generation by the address generating means in accordance with results of detection performed by the detecting means, wherein addresses are generated that are capable of scanning the two-dimensionally arrayed data in zigzag fashion.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 2 is a diagram showing the control states of UD counters according to the embodiment;

FIG. 11 is a detailed block diagram showing the construction of a predictive coding circuit illustrated in FIG. 10;

DESCRIPTION OF THE PREFERRED EMBODIMENTS

A preferred embodiment of the present invention will now be described with reference to the accompanying drawings.

Figure 1:
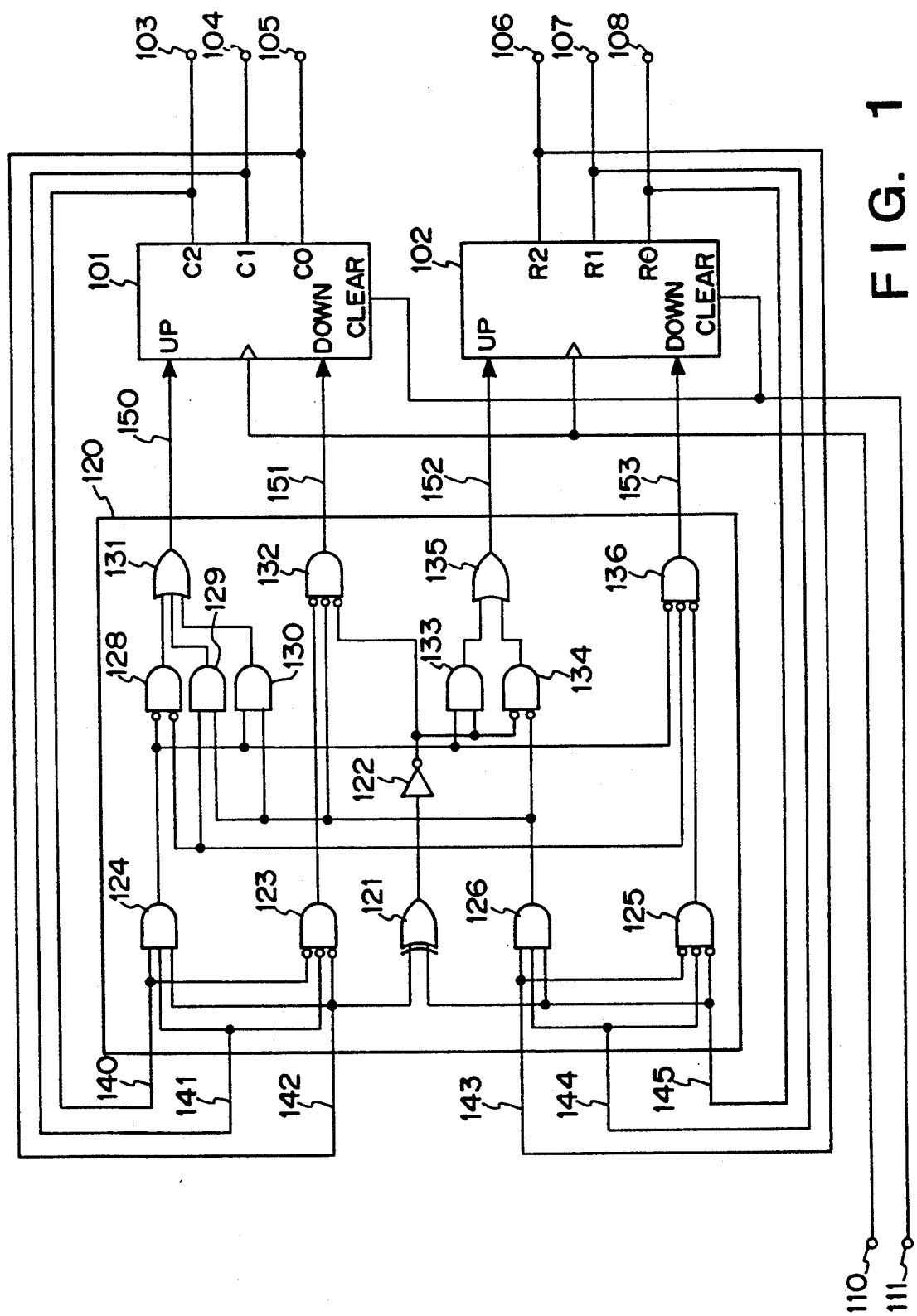
FIG. 1 is a circuit diagram showing the construction of an address generating circuit according to an embodiment of the present invention.

FIG. 1 is a circuit diagram showing the construction of an address generating circuit according to a first embodiment of the present invention.

As shown in FIG. 1, the address generating circuit includes an up/down counter (hereinafter referred to as a "UD counter") 101 for generating addresses in the column direction of a two-dimensional array, a UD counter 102 for generating addresses in the row direction of a two-dimensional array, output terminals 103–105 for outputting column addresses of three bits, output terminals 106–108 for outputting row addresses of three bits, input terminals 110, 111 for inputting a clock and a clearing signal, respectively, to the UD counters 101, 102, and a block 120 for producing an up-count control signal and a down-count control signal for the UD counters 101, 102 based upon output signals from the UD counters 101, 102. The block 120 includes logic elements 121–136.

Before describing the operation of the circuit shown in FIG. 1, the concept of the present invention will be discussed.

The address sequence of zigzag scanning possesses regularity, though it may appear irregular at first glance. That is, in a case where the column and row addresses agree with each other in terms of both being odd or even numbers, scanning is performed toward the upper right; if they do not agree, scanning is performed toward the lower left. In other words, scanning toward the upper right corresponds to incrementing the value of the column address and decrementing the value of the row address, and scanning toward the lower left corresponds to incrementing the value of the row address and decrementing the value of the column address.

Since the column and row addresses thus require up-count and down-count operations, each address is generated by a respective independent UD counter, and a circuit is additionally provided for deciding the control signal of each UD counter from the present output address value. Thus is constructed the address generating circuit of the present invention.

Though zigzag scanning addresses basically operate in accordance with the regularity mentioned above, there is some processing which constitutes an exception. This occurs when scanning the peripheral (edge) portion of a two-dimensional array. For example, when the row address is "0" and the column address is "4", the next row address in accordance with the aforementioned rule becomes "−1", which is completely meaningless.

In this case, it is necessary that solely the value of the column address be incremented, and that the value of the row address be held at the previous value. This exceptional processing is of four types, namely one type for each of the sides of the two-dimensional array. When the column address takes on a value of "0" or "7" or the row address takes on a value of "0" or "7", the exceptional processing can be dealt with easily by detecting this condition.

The determination as to whether the column and row addresses agree with each other in terms of both being even or odd numbers can be performed by comparing the least significant bits of both addresses.

More specifically, the operations of the UD counters can be controlled uniquely based upon the results of comparing the least significant bits of both addresses and depending upon whether the value of each address is "0" or "7. This is summarized in FIG. 2. Accordingly, the address generating circuit shown in FIG. 1 can be constructed merely by combining a circuit for detecting the address values shown in FIG. 2, a circuit for generating the control signals of the UD counters from the results of detection, and the UD counters.

The operation of the address generating circuit according to this embodiment will now be described.

First, the clearing signal enters from the terminal 111 to clear the UD counters 101, 102 to "0". At this time the address signal outputted by the terminals 103–108 is "00". The address value is simultaneously inputted to the block 120 through signal lines 140–145. Within the block 120, detection of the address values of FIG. 2 is initially performed based upon the inputted address information. The elements which perform this detection operation are 121 through 126. Specifically, CO=RO is detected by elements 121 and 122, CA=0 by element 123, CA=7 by element 124, RA=0 by element 125, and RA=7 by element 126.

Since the inputted address presently is "00", CA=0, RA=0 is detected by the elements 123, 125, the output values thereof are high, and the output values of the elements 124, 126 are low. In addition, since the least significant bits of both addresses are "0" and therefore agree, the output value of element 121 is low and the output of element 122 is high.

As a result, signal 150 goes high via the elements 128, 131, and all of the other signals 151-153 go low. Here the signal 150 is a control signal which causes the UD counter 101 to count up, and the signal 151 is a control signal which causes the UD counter 101 to count down. The signals 152, 153 are control signals which perform similar operations with regard to the UD counter 102. When one clock pulse is supplied from the terminal 110, only the UD counter 101 is counted up, whereby the outputted address value becomes "01".

This address value enters the block 120 through the signal lines 140-145 just as previously. Now the outputs of elements 121, 125 go high, and the outputs of the other elements 123, 124, 126 all go low. As a result, the signal line 152 goes high via the elements 122, 134, 135, the signal line 151 goes high via the elements 122, 132, and the other signal lines 150, 153 go low.

When the next clock pulse is supplied by the terminal 110, the UD counter 101 is counted down from "1" to "0", and the other UD counter 102 is counted up from "0" to "1". The output address value at this time becomes "10".

This output address value enters the block 120. Now the outputs of elements 121, 123 go high, and the outputs of the other elements 124, 125, 126 all go low. As a result, only the signal line 152 goes high via the elements 122, 134, 135, and all the other signal lines 150, 151, 153 go low. When the next clock pulse is supplied by the terminal 110, only the UD counter 102 is counted up from "1" to "2", and the output address value becomes "20".

Figure 6:
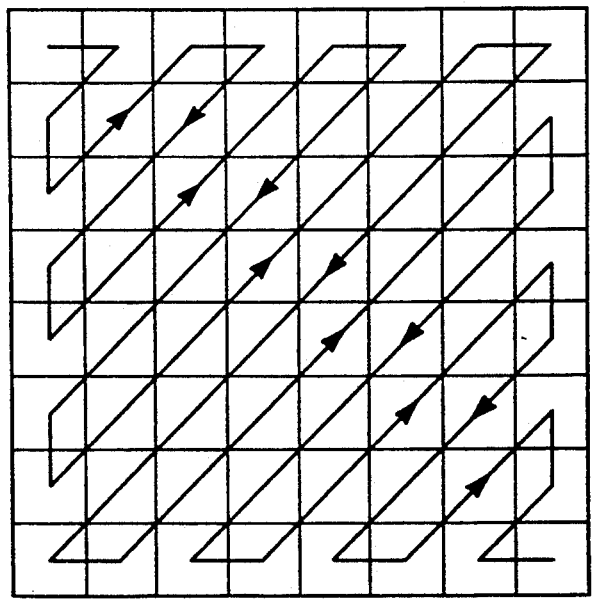
FIG. 6 is a diagram showing a zigzag scanning sequence.

Thereafter, and in similar fashion, the address values having the sequence shown in FIG. 6 continue to be outputted at every clock pulse. After the final address, namely the address corresponding to the lower-right-most position in FIG. 6, has been outputted, there is no rule that any further output need be produced. Usually, however, when a counter has counted up to its maximum value, the output often is returned to zero. In this embodiment also, therefore, the arrangement is such that the counters return to their initial starting addresses. More specifically, when the final address value "77" enters the block 120, the signal lines 150, 152 go high, and the UD counters 101, 102 are both counted up after application of a clock pulse, as a result of which each counter returns to "0".

Figure 3:
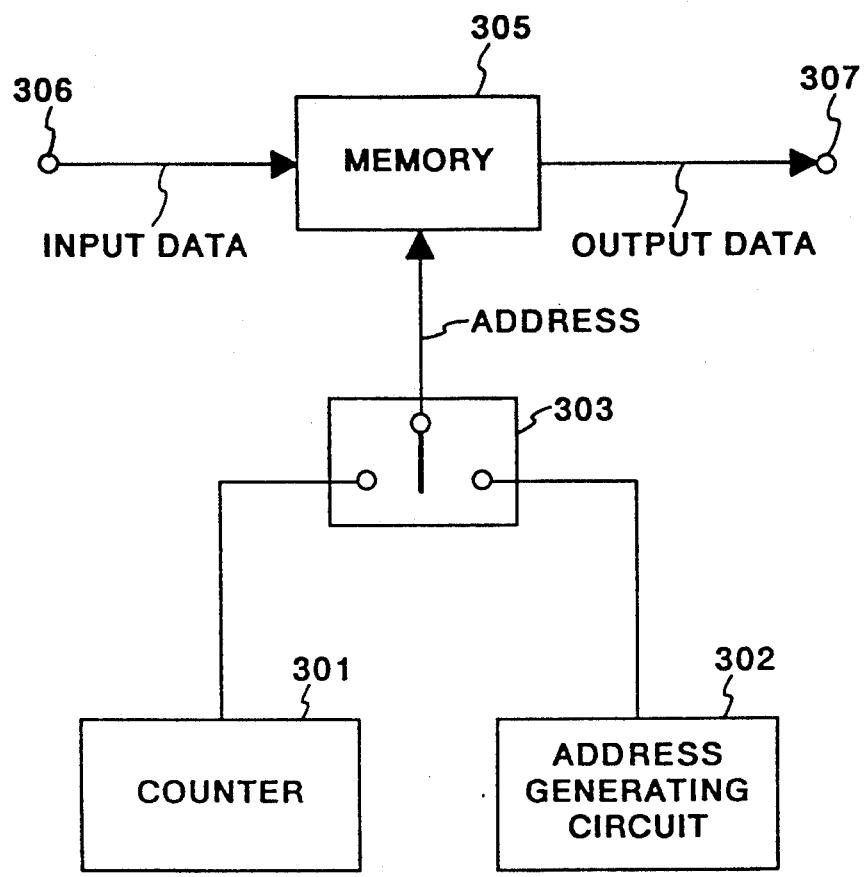
FIG. 3 is a block diagram showing the construction of a scan converting buffer using the address generating circuit according to the embodiment.
Figure 7:
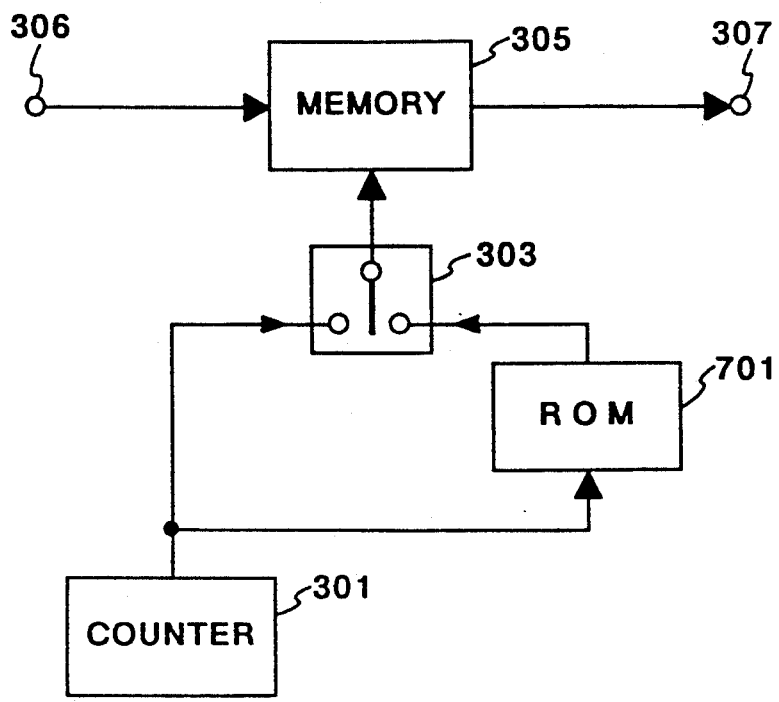
FIG. 7 is a block diagram showing the construction of a scan converting buffer according to the prior art.
Figure 8:
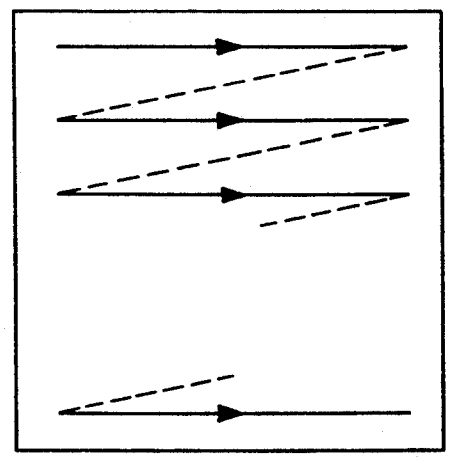
FIGS. 8(a) and (b) are diagrams showing ordinary scanning sequences.
Figure 8:
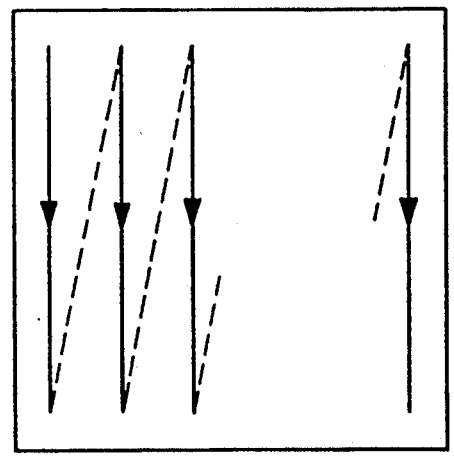
Figure 9:
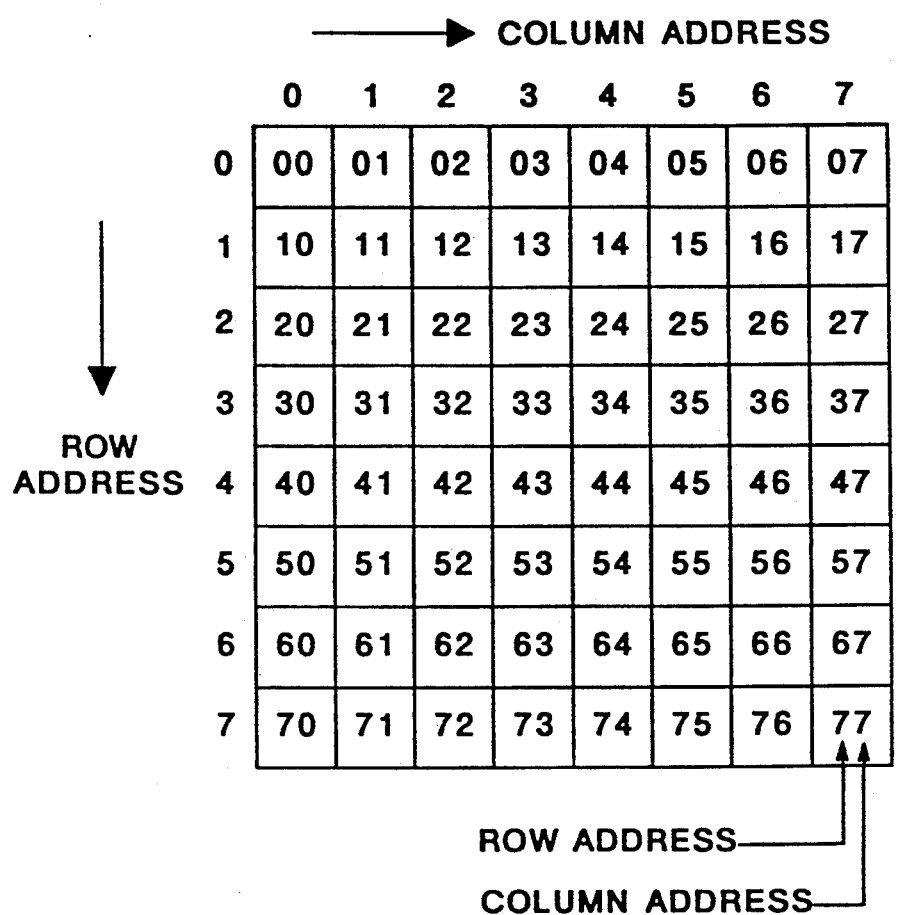
FIG. 9 is a diagram showing addresses at which data is stored.

It should be noted that when a scan converting circuit is constructed using the address generating circuit of this embodiment, the result is as shown in FIG. 3. This circuit replaces the ROM 701 shown in FIG. 7.

A second embodiment of the present invention will now be described with reference to the associated drawings.

Figure 4:
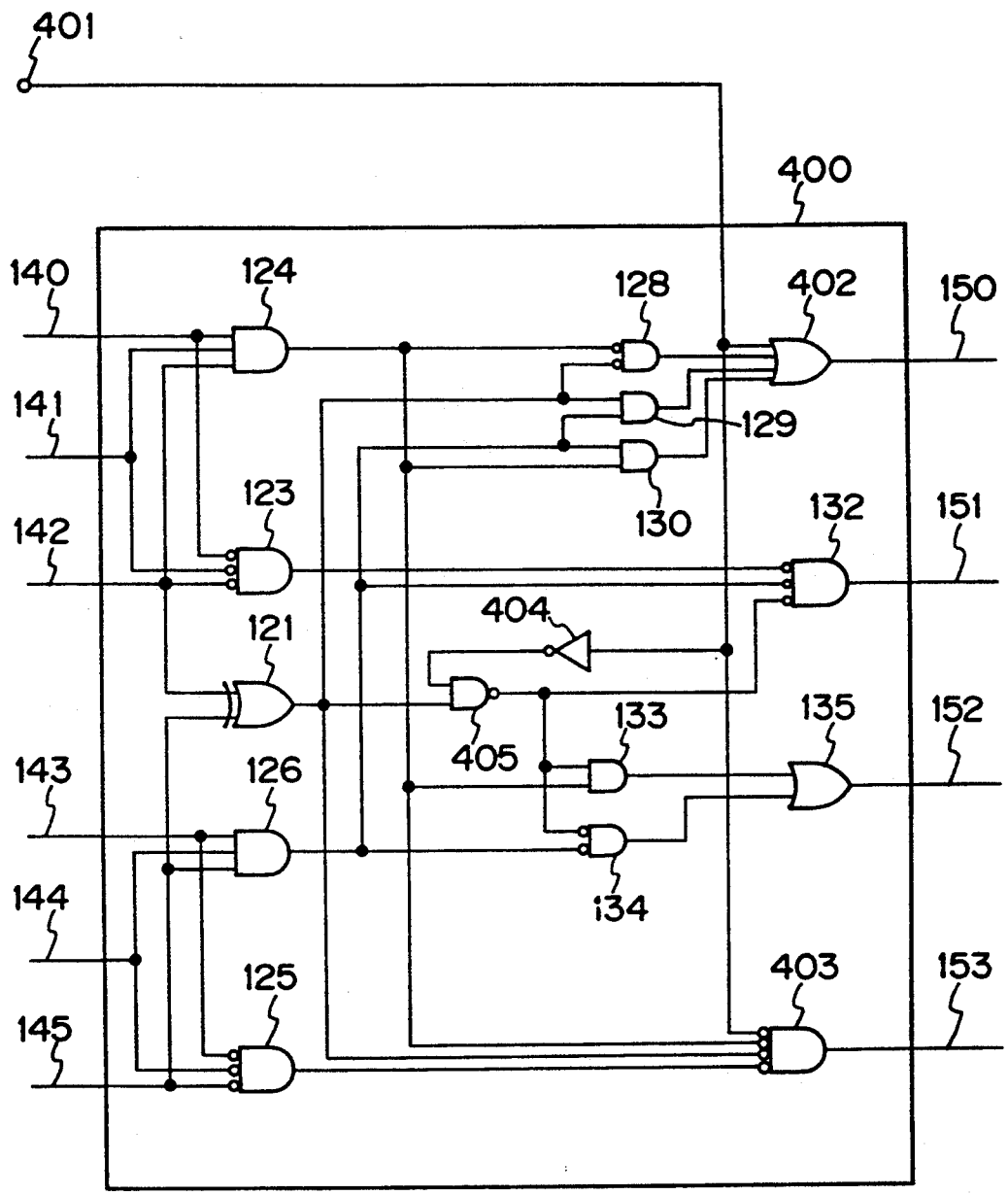
FIG. 4 is a circuit diagram showing the construction of an address generating circuit according to another embodiment of the present invention.

FIG. 4 is a circuit diagram showing the construction of an address generating circuit according to a second embodiment of the present invention. In this embodiment, the counter 301 and zigzag address generating circuit 302 shown in FIG. 3 are combined.

As set forth earlier, the zigzag address generating circuit 302 includes two the independent UD counters 101, 102. The counter 301 is a so-called binary counter and functionally is included in the UD counters 101, 102.

Here some logic is added to the circuit shown in FIG. 1 so that the two UD counters 101, 102 will be capable of operating as binary counters.

More specifically, the basic construction of the circuitry is the same; only the internal construction of the block 120 in FIG. 1 is changed. Accordingly, FIG. 4 illustrates only a block 400, which corresponds to the block 120. In FIG. 4, signal lines and elements whose functions are the same as those in block 120 are designated by like reference numerals, and a description thereof is deleted.

The operation of the circuit shown in FIG. 4 will now be described.

In FIG. 4, newly added components are a terminal 401 and an element 404, and components that have been modified are elements 402, 403, 405.

As already described, the address generating circuit of this embodiment is capable of generating two types of addresses, namely addresses for writing and reading relative to the memory 305. Therefore, a mode selection signal for selecting either of these types is newly required. The terminal 401 is for the purpose of inputting this signal. When the signal entered from terminal 401 is low, the block 400 operates in exactly the same way as the block 120 shown in FIG. 1.

Conversely, when the signal entered from the terminal 401 is high, the address generating circuit acts as a binary counter. The reason for this is as follows: Owing to the modified element 402, signal 150 is high at all times, and signal 151 is low at all times owing to elements 404, 405 and 302. As a result, the UD counter 101 shown in FIG. 1 performs the count-up operation at all times. Similarly, owing to the modified element 403, signal 153 is low at all times, and signal 152 goes high, under certain conditions, owing to elements 404, 405 and 133 and 135. As a result, the UD counter 102 shown in FIG. 1 operates as the higher-order counter of UD counter 101.

If the address generating circuit is constructed using the block 400 according to this embodiment, it can be used as both an address generating circuit for raster scanning and an address generating circuit for zigzag scanning. As a result, the scanning conversion buffer takes on the construction shown in FIG. 5, which represents a major simplification.

In the embodiments described above, an 8×8 two-dimensional array is taken as an example. However, this does not impose a restriction upon the present invention, for addresses in a zigzag scan can be generated in a similar manner for any two-dimensional array.

Figure 5:
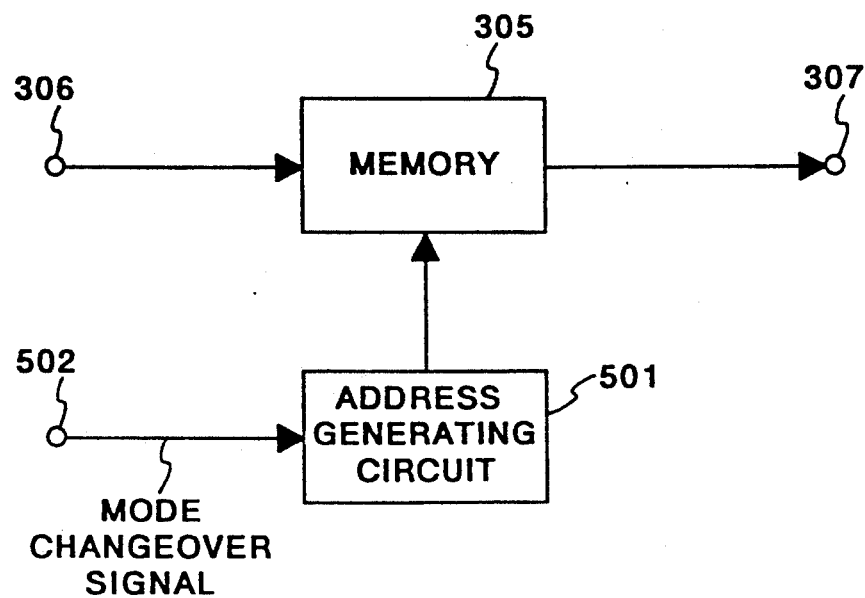
FIG. 5 is a block diagram showing the construction of a scan converting buffer using the address generating circuit according to the other embodiment of the invention.
Figure 10:
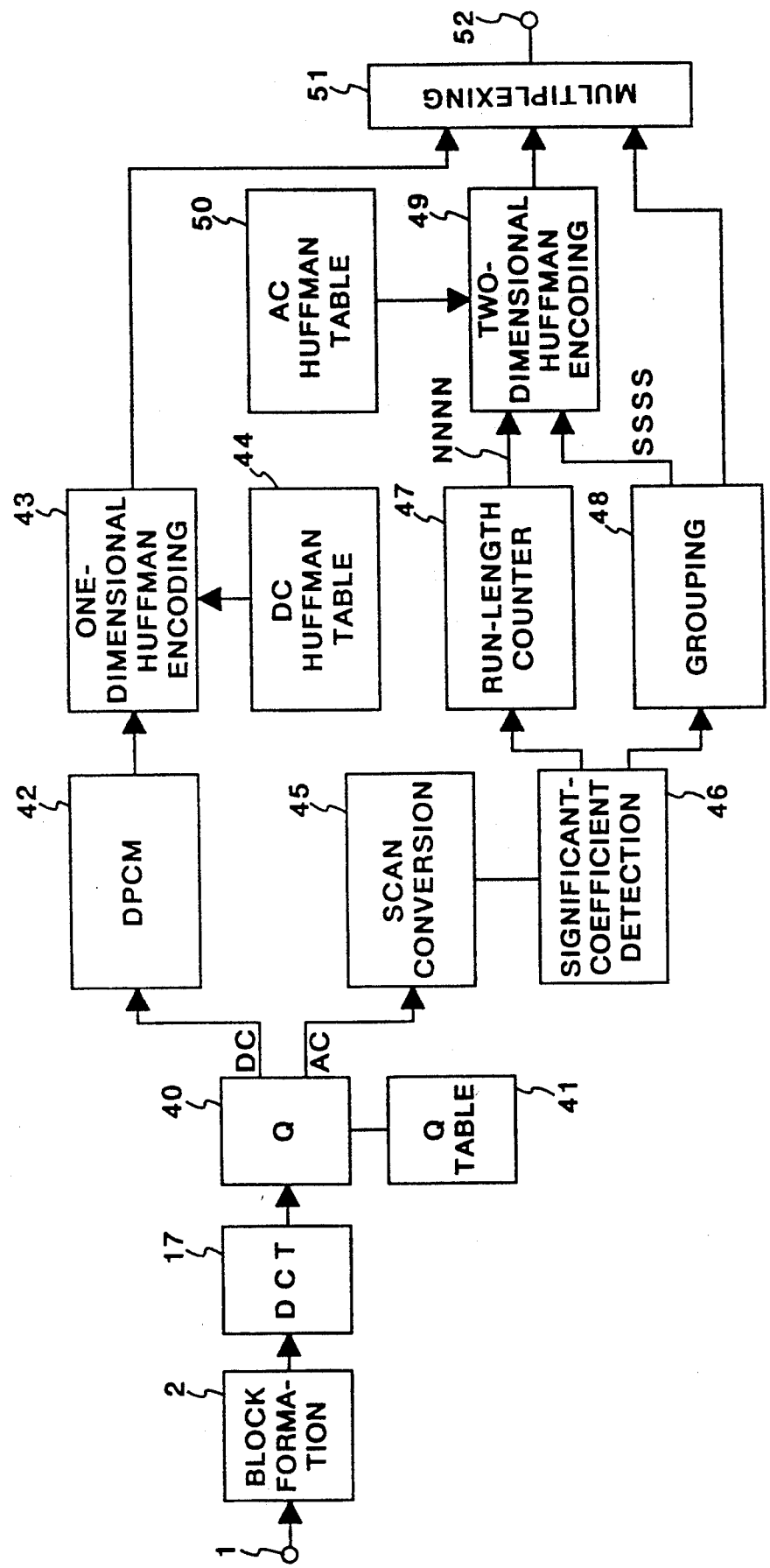
FIG. 10 is a block diagram showing the overall construction of a encoding apparatus.

FIG. 10 is a block diagram showing the overall construction of a coding apparatus which includes the scan converter shown in FIGS. 3 and 5.

As shown in FIG. 10, pixel data entered from an input terminal 1 is cut into an 8×8 pixel block in a block forming circuit 2, the data is subjected to a cosine transformation by a discrete cosine transformation (DCT) circuit 17, and the transformation coefficients are supplied to a quantizer (Q) 40. In accordance with quantization-step information supplied by a quantization table 41, the quantizer 40 subjects the transformation coefficients to linear quantization. Of the quantized transformation coefficients, a DC coefficient is applied to a predictive coding circuit (DPCM) 42, which obtains the difference (a prediction error) between this DC coefficient and the DC component of the preceding block. The difference is applied to a one-dimensional Huffman coding circuit 43.

FIG. 11 is a detailed block diagram showing the predictive coding circuit 42 illustrated in FIG. 10.

The DC coefficient quantized by the quantizer 40 is applied to a delay circuit 53 and a subtracter 54. The delay circuit 53 applies a delay equivalent to the time needed for the discrete cosine transformation circuit to operate on one block, namely 8×8 pixels. Accordingly, the delay circuit 53 supplies the subtracter 54 with the DC coefficient of the preceding block. As a result, the subtracter 54 outputs the difference (prediction error) between the current DC coefficient and that of the preceding block. (In this predictive coding circuit 42, the value of the preceding block is used as the prediction value, and therefore the circuit 42 is constituted by the delay circuit 53, as set forth above.)

In accordance with a DC Huffman code table 44, the one-dimensional Huffman coding circuit 43 depicted in FIG. 10 applies variable-length encoding to the prediction error signal supplied by the predictive coding circuit 42 and supplies the result to a multiplexer circuit 51, described below, as a DC Huffman code.

Figure 12:
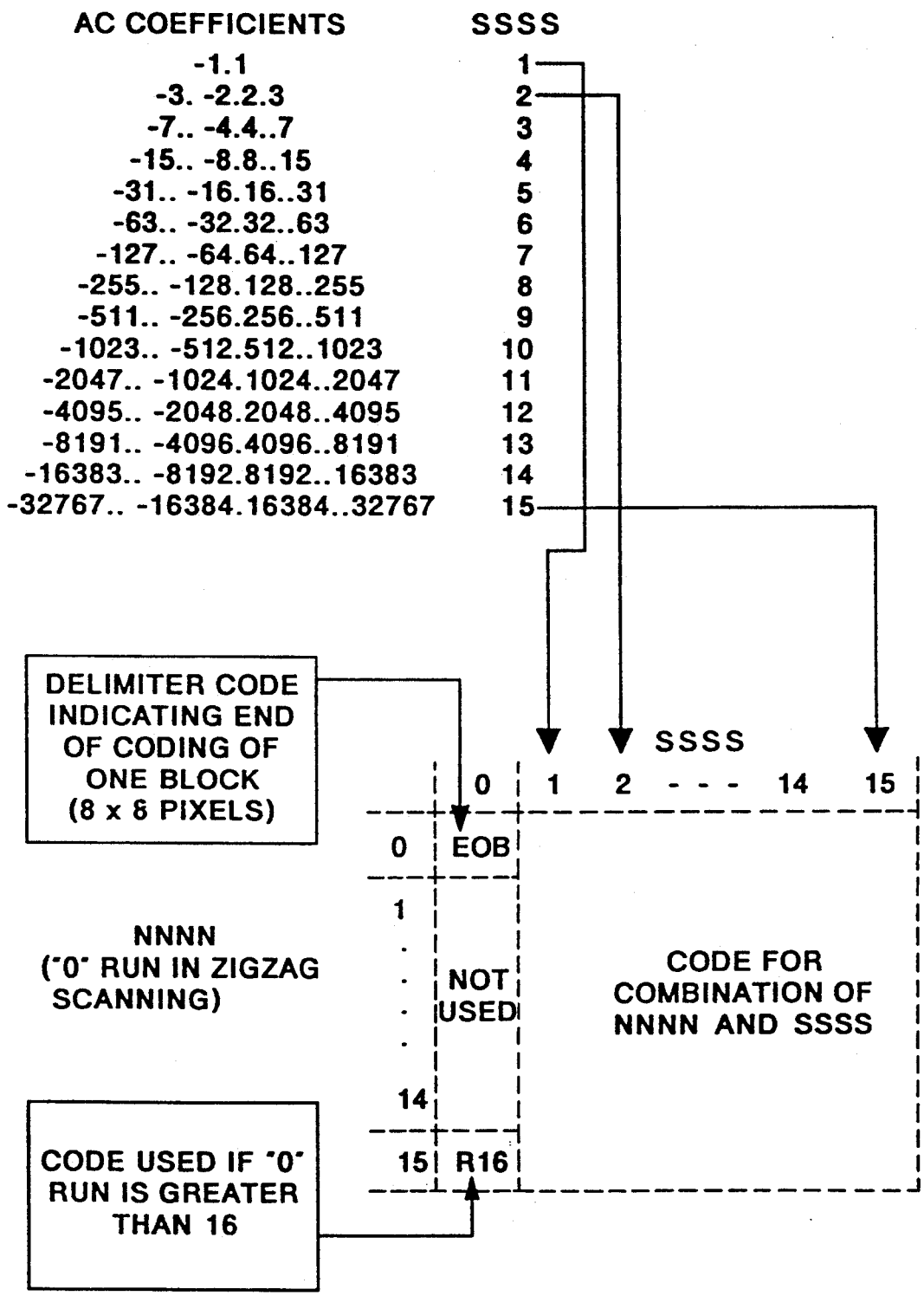
FIG. 12 is a diagram showing the group numbers of AC coefficients as well as annexed bits.

An AC coefficient (a coefficient other than the DC coefficient) quantized by the quantizer 40 is zigzag-scanned in order from lower-order coefficients as shown in FIG. 6 by means of the scan converting circuit 45 (of the kind shown in FIGS. 3 and 5), and the output of the scan converting circuit 45 is applied to a significant-coefficient detector circuit 46. The latter determines whether the quantized AC coefficient is "0" or not. If the AC coefficient is "0", a count-up signal is supplied to a run-length counter 47, thereby incrementing the counter by "+1". If the coefficient is other than "0", however, a reset signal is applied to the run-length counter 47 to reset the counter, and the coefficient is split into a group number SSSS and added bits, as shown in FIG. 12, by a grouping circuit 48. The group number SSSS is supplied to a two-dimensional Huffman coding circuit 49, and the added bits are supplied to the multiplexer 51.

The run-length counter 47 counts a run length of "0" and supplies the two-dimensional Huffman coding circuit 49 with the number NNNN of "0"s between significant coefficients other than "0". In accordance with the AD Huffman code table 50, the two-dimensional Huffman coding circuit 49 applies variable-length encoding to the "0" run length NNNN and the significant-coefficient group number SSSS and supplies the multiplexer 51 with an AC Huffman code.

The multiplexer 51 multiplexes the DC Huffman code, AC Huffman code and added bits of one block (8×8 input pixels) and outputs compressed image data from its output terminal 52.

Accordingly, the compressed image data outputted by the output terminal 52 is stored in a memory, and at read-out the data is expanded by a reverse operation, thereby making it possible to reduce memory capacity.

FIG. 13 is a block diagram showing a decoding apparatus added to the encoding apparatus of FIG. 10. Portions in FIG. 13 that are the same as those in FIG. 10 are designated by like reference characters and need not be described again. Numeral 52' denotes an encoded data input terminal, 51' a separating circuit for separating the encoded data into a DC Huffman code, an AC Huffman code and annexed bits, 50' an AC Huffman table, 49' a two-dimensional Huffman decoding circuit, 48' a mixing circuit for combining the group number SSSS and annexed bits, 47' a "0"-run generating circuit for generating a "0" run length based upon run-length data NNNN, 46' a mixing circuit for outputting zigzag data based upon the output data from the "0"-run generating circuit 47' and combining circuit 48', 44' a DC Huffman table, 43' a one-dimensional Huffman decoding circuit, 42' a reverse-DPCM circuit, 41' a quantization table, 40' a reverse quantizer, 17' a reverse DCT circuit, 2' a raster forming circuit, and 1' an output terminal.

This embodiment is characterized in that the scan converting circuit 45' can be used both for encoding and decoding. The construction of the scan converting circuit 45' is the same as that shown in FIG. 4. The mode changeover signal 401 is controlled by a CPU (not shown) in such a manner that, at the time of encoding, a raster scanning address is generated when storing data in a memory and a zigzag scanning address is generated when reading data out of the memory. Similarly, the mode changeover signal 401 is controlled in such a manner that, at the time of decoding, a zigzag scanning address is generated when storing data in the memory and a raster scanning address is generated when reading data out of the memory.

Thus, the circuit construction can be simplified in accordance with this embodiment since the scan converting circuit is used both for encoding and decoding.

Thus, in accordance with the embodiments described above, there is provided an address generating circuit which includes address generating means for generating column and row addresses of two-dimensionally arrayed data, detecting means for detecting, based upon addresses from the address generating means, whether an address is situated on an edge portion of the two-dimensionally arrayed data, and control means for controlling the address generating means in accordance with the result from the detecting means. This makes it possible to construct, with fewer component parts and at lower cost, an address generating circuit which generates addresses capable of scanning the two-dimensionally arrayed data in zigzag fashion.

As many apparently widely different embodiments of the present invention can be made without departing from the spirit and scope thereof, it is to be understood that the invention is not limited to the specific embodiments thereof except as defined in the appended claims.

What is claimed is:

1. An address generating circuit for generating addresses of a memory which stores two-dimensionally arrayed data, comprising:
   address generating means for generating column and row addresses of the two-dimensionally arrayed data;
   wherein said address generating means comprises storing means for storing temporarily an address of the memory and a logic circuit for performing a logic operation and renewing the address temporarily stored in said storing means, and wherein the addresses being generated are capable of scanning the two-dimensionally arrayed data in zigzag fashion.

2. The address generating circuit according to claim 1, wherein said storing means comprises two up/down counters and each counter value is outputted as a respective column address or row address of the two-dimensionally arrayed data.

3. The address generating circuit according to claim 1, wherein said logic circuit is constituted by a plurality of logic elements.

4. The address generating circuit according to claim 2, further comprising control means for controlling up-counting or down-counting of each of said up/down counters.

5. An address generating circuit comprising:
first address generating means for generating means data for raster scanning; and
second address generating means for generating address data for zigzag scanning;
wherein said first and second address generating means are constituted by a common storing means for storing temporarily an address data and a common logic circuit for performing a logic operation and renewing the address data temporarily stored in said storing means.

6. The address generating circuit according to claim 5, wherein said storing means comprising two up/down counters and each counter value is outputted as a respective column address or row address of the two-dimensionally arrayed data.

7. The address generating circuit according to claim 6, further comprising control means for controlling up-counting or down-counting of each of said up/down counters.

8. The address generating circuit according to claim 5, wherein said logic circuit is constituted by a plurality of logic elements.

9. An apparatus comprising:
encoding means for encoding image data; and
decoding means for detecting encoded data;
wherein said encoding means and said decoding means include common address generating means for generating addresses of a memory which stores two-dimensionally arrayed data for converting a scanning direction of the arrayed data.

10. The address generating circuit according to claim 9, wherein said address generating means comprises storing means for storing temporarily an address of the memory and a logic circuit for performing a logic operation and renewing the address temporarily stored in said storing means.

11. The address generating circuit according to claim 10, wherein said storing means comprises two up/down counters and each counter value is outputted as a respective column address or row address of the two-dimensionally arrayed data.

12. The address generating circuit according to claim 11, further comprises control means for controlling up-counting or down-counting of each of said up/down counters.

13. The address generating circuit according to claim 10, wherein said logic circuit is constituted by a plurality of logic elements.

* * * * *

UNITED STATES PATENT AND TRADEMARK OFFICE
CERTIFICATE OF CORRECTION

PATENT NO. : 5,296,938
DATED : March 22, 1994
INVENTOR(S) : TADAYOSHI NAKAYAMA

It is certified that error appears in the above-indentified patent and that said Letters Patent is hereby corrected as shown below:

COLUMN 3

Figure 13A:
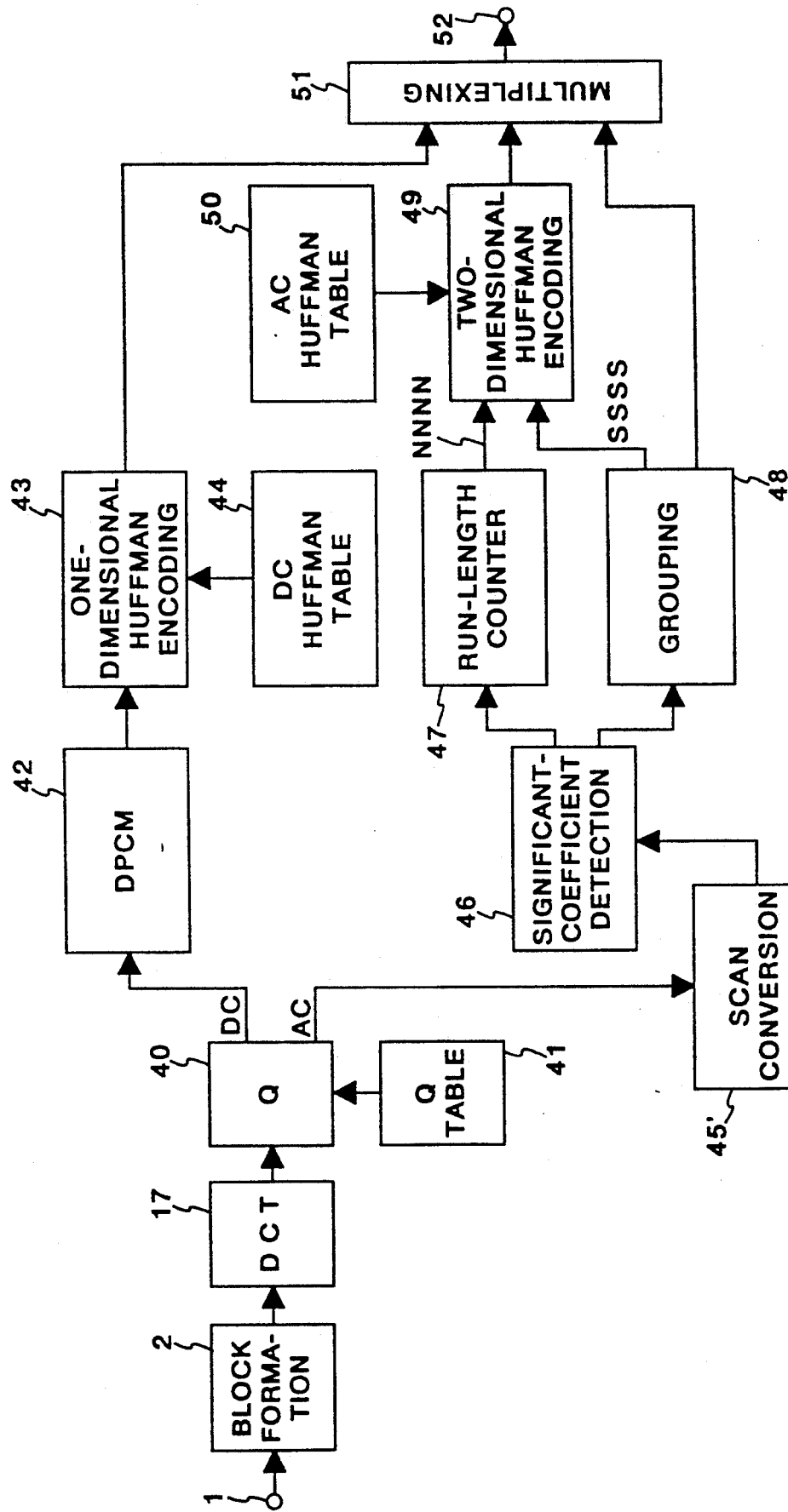
FIG. 13A and 13B is a block diagram showing a decoding apparatus added to the encoding apparatus of FIG. 10.
Figure 13B:
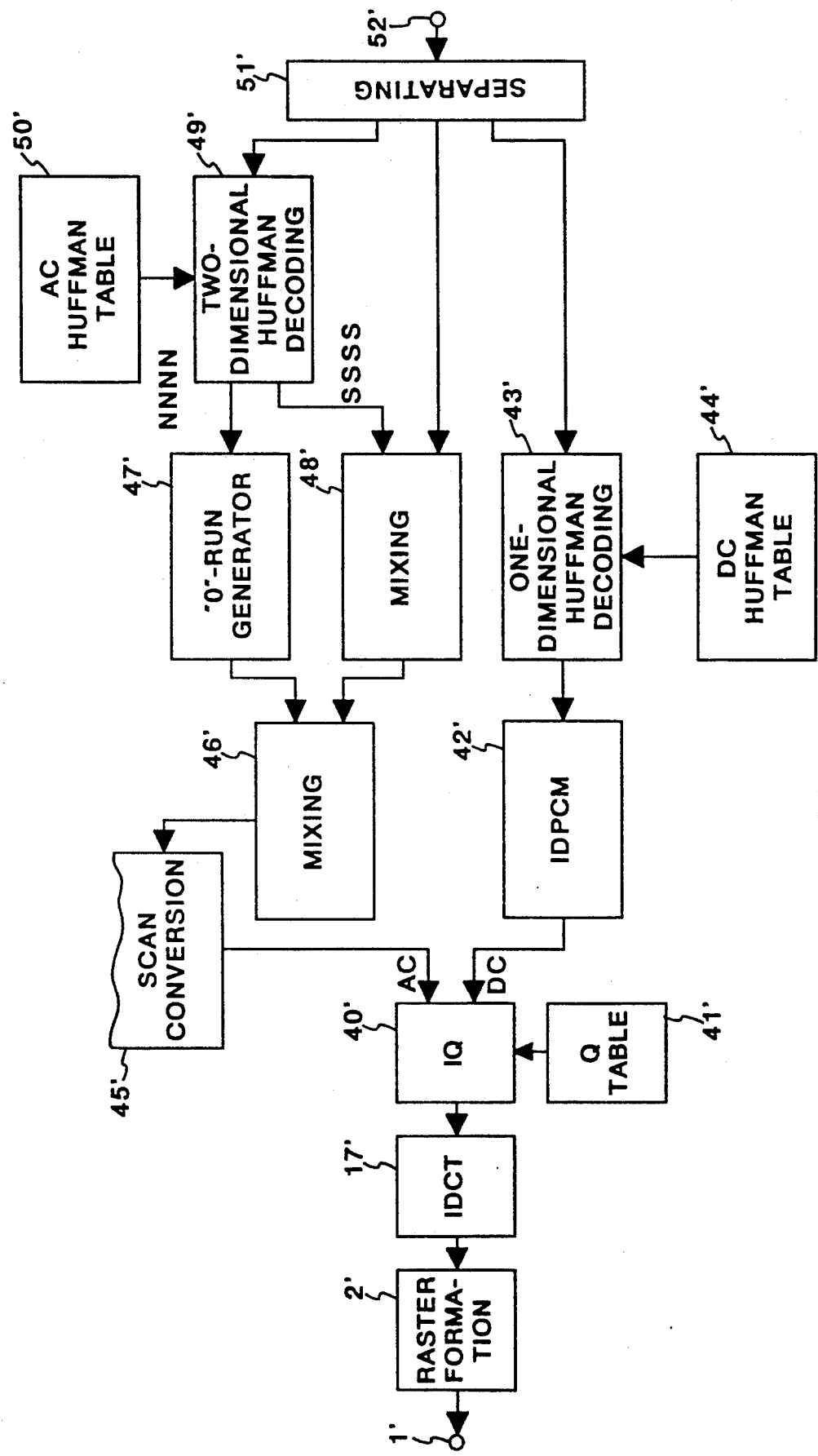

Line 41, "FIG. 13A and 13B is a" should read --FIGS. 13A and 13B are-- and "diagram" should read --diagrams--.

COLUMN 6

Line 2, "two the" should read --the two--.

COLUMN 9

Line 10, "means" (second occurrence) should read --address--.
    Line 22, "comprising" should read --comprises--.

Signed and Sealed this

Eighteenth Day of October, 1994

Attest:

BRUCE LEHMAN

Attesting Officer    Commissioner of Patents and Trademarks